United States Patent
Wohlgemuth et al.

(10) Patent No.: US 11,531,048 B2
(45) Date of Patent: Dec. 20, 2022

(54) VOLTAGE DIAGNOSTIC CIRCUIT

(71) Applicant: WAGO Verwaltungsgesellschaft mit beschraenkter Haftung, Minden (DE)

(72) Inventors: Christopher Wohlgemuth, Minden (DE); Christian Voss, Minden (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 174 days.

(21) Appl. No.: 16/922,662

(22) Filed: Jul. 7, 2020

(65) Prior Publication Data
US 2020/0333381 A1 Oct. 22, 2020

Related U.S. Application Data

(63) Continuation of application No. PCT/IB2018/060187, filed on Dec. 17, 2018.

(30) Foreign Application Priority Data

Jan. 8, 2018 (DE) ..................... 10 2018 000 063.0

(51) Int. Cl.
*G01R 19/165* (2006.01)
*G11C 19/00* (2006.01)

(52) U.S. Cl.
CPC ........ *G01R 19/16528* (2013.01); *G11C 19/00* (2013.01)

(58) Field of Classification Search
CPC .. G01R 19/16528; G11C 19/00; G11C 5/148; G11C 5/143; G11C 29/021; G06F 1/28; G06F 13/4282; G06F 13/122
See application file for complete search history.

(56) References Cited

U.S. PATENT DOCUMENTS

| | | | |
|---|---|---|---|
| 7,295,051 B2 | 11/2007 | Li et al. | |
| 7,554,778 B2* | 6/2009 | Chapuis | G06F 1/26 361/62 |
| 9,142,950 B2 | 9/2015 | Voss | |
| 10,126,337 B2 | 11/2018 | Menard et al. | |
| 10,817,438 B2 | 10/2020 | Voss et al. | |
| 2017/0184642 A1* | 6/2017 | Menard | G01R 19/16528 |

FOREIGN PATENT DOCUMENTS

DE 102016201141 A1 7/2017
EP 2738990 A1 6/2014

OTHER PUBLICATIONS

International Search Report dated Jun. 25, 2019 in corresponding application PCT/IB2018/060187.

* cited by examiner

*Primary Examiner* — Farhana A Hoque
(74) *Attorney, Agent, or Firm* — Muncy, Geissler, Olds & Lowe, P.C.

(57) ABSTRACT

A circuit for monitoring an output voltage of a voltage supply is shown. The circuit comprises a microcontroller for controlling a system, a shift register and a diagnostic circuit. The microcontroller has an input for receiving serial output data of the shift register, wherein the input is connected to the serial output of the shift register. The diagnostic circuit is designed to diagnose the voltage supply and has a diagnostic output which is connected to a data input of the shift register for inputting a diagnostic bit.

16 Claims, 5 Drawing Sheets

VOLTAGE DIAGNOSTIC CIRCUIT

This nonprovisional application is a continuation of International Application No. PCT/IB2018/060187, which was filed on Dec. 17, 2018, and which claims priority to German Patent Application No. 10 2018 000 063.0, which was filed in Germany on Jan. 8, 2018, and which are both herein incorporated by reference.

BACKGROUND OF THE INVENTION

Field of the Invention

The present invention relates to a circuit for monitoring a voltage supply.

Description of the Background Art

For monitoring a voltage supply, microcontrollers are known from the prior art which have a separate diagnostic pin for connection to a diagnostic circuit, the microcontrollers being configured to read in and evaluate a status signal provided by the diagnostic circuit with respect to the voltage supply via the separate diagnostic input pin.

SUMMARY OF THE INVENTION

It is therefore an object of the present invention to provide a microcontroller for reading in a status signal provided by a diagnostic circuit does not require a separate diagnostic input pin. Instead, the status signal is read in according to the invention via a serial input of the microcontroller, the serial input being connected to a serial output of a shift register. The shift register has at least one data input, which is connected to a diagnostic output of a diagnostic circuit for inputting the status signal.

The term "serial input" can be understood as a connection (or input pin), via which data can be read in sequentially at a certain clock pulse. Analogously, the term "serial output" can be understood as a connection (or output pin) via which the data can be read out sequentially at a certain clock pulse.

Furthermore, the term "shift register" can be understood in particular as a circuit having a plurality of memory units (for example flip flops) connected in series, the memory content of which (for example, for 1 bit) is moved by one memory unit at each working cycle. Further, the term "diagnostic circuit" can be understood as a circuit that monitors the correctness of a circuit operation or its conditions, and which signalizes recognized, actual, or possible impairments.

The data input is preferably part of a parallel interface of the shift register.

The term "parallel interface" can be understood as an interface via which several (in particular independent) signals can be scanned in parallel (and thus in particular simultaneously).

For example, the data input of the shift register is set up to store the diagnostic bit in a memory location, the content of which is output first with the serial output.

The term "diagnostic bit" can be understood to be a signal representing one of two different values, wherein the values characterize the state of the voltage supply, for example, the voltage supply is "fault-free" and the voltage supply is "faulty". Furthermore, the wording "output first" as used in the description and the claims is to be understood in particular as an output which occurs prior to outputting additional bits, which are also stored in the shift register.

The shift register can be set up for applying a value corresponding to the diagnostic bit at the input of the microcontroller without a clock signal being applied at a clock input of the shift register and/or a logic voltage being applied to the shift register.

The wording "without a clock signal being applied" can mean that between the application of a value corresponding to the diagnostic bit at the input of the microcontroller and the application of a clock signal, there is no positive causal relationship.

For example, the circuit further comprises one or more sensors which are designed for connection to a second voltage supply, wherein one or more data inputs of the shift register are connected to the one or more sensors for inputting sensor data.

The term "sensor" can be understood as a unit which is set up to derive electrical signals from environmental changes, which characterize the environmental changes within the scope of a measuring accuracy.

The diagnostic circuit can be designed for connection to the second voltage supply.

The term "voltage supply" can be understood in particular to mean a circuit which provides a (substantially) constant supply voltage or a supply voltage with an essentially constant effective value on the output side.

The diagnostic circuit can be set up to signal an undervoltage or overvoltage of the second voltage supply by means of a bit value.

The term "undervoltage/overvoltage" can be understood to mean a voltage, which, i.e., whose effective value, falls below or exceeds a fixed threshold value, which is below or above a nominal value.

The microcontroller according to the invention (or a circuit comprising the microcontroller, which may include some or all of the above elements) can also be used in a method for monitoring an output voltage of a voltage supply. E.g., (the diagnostic circuit) can monitor whether the output voltage is in a target voltage range and a bit value symbolizing the result is in a readout position of a shift register, which can be read out first via a serial interface of the shift register by the microcontroller.

The term "microcontroller" can be understood in particular as an integrated circuit which comprises a processor and whose housing has a plurality of connection pins assigned at inputs for connecting the microcontroller to other circuit parts.

A voltage which represents the bit value stored in the first readout position of the shift register can continually be applied to a signal line connected to the serial interface, which connects the microcontroller to the shift register, whereby the status value is made available to the microcontroller even without a clock pulse signal.

For example, the signal line (possibly via an electrical isolation such as an optocoupler) can be connected to a connection pin of the microcontroller housing, which means that a level corresponding to the diagnostic bit value, applied to the signal line during readout pauses, continues to be available via the serial input of the microcontroller (in an updated form) and can be read in and evaluated by the microcontroller at any time for checking the supply voltage.

The method may further includes controlling a system on the basis of measurement data read out from the shift register, wherein the measurement data is generated by sensors at which the output voltage or a voltage derived from (generated by) the output voltage is applied.

The term "system" can be understood in particular to mean an automation system which comprises sensors and actuators, which are supplied with a field supply (for example 24V). The option of monitoring the supply voltage thus allows for the detection of situations in which the measurement data was produced under adverse circumstances and is therefore incorrect, (possibly with) a higher probability.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
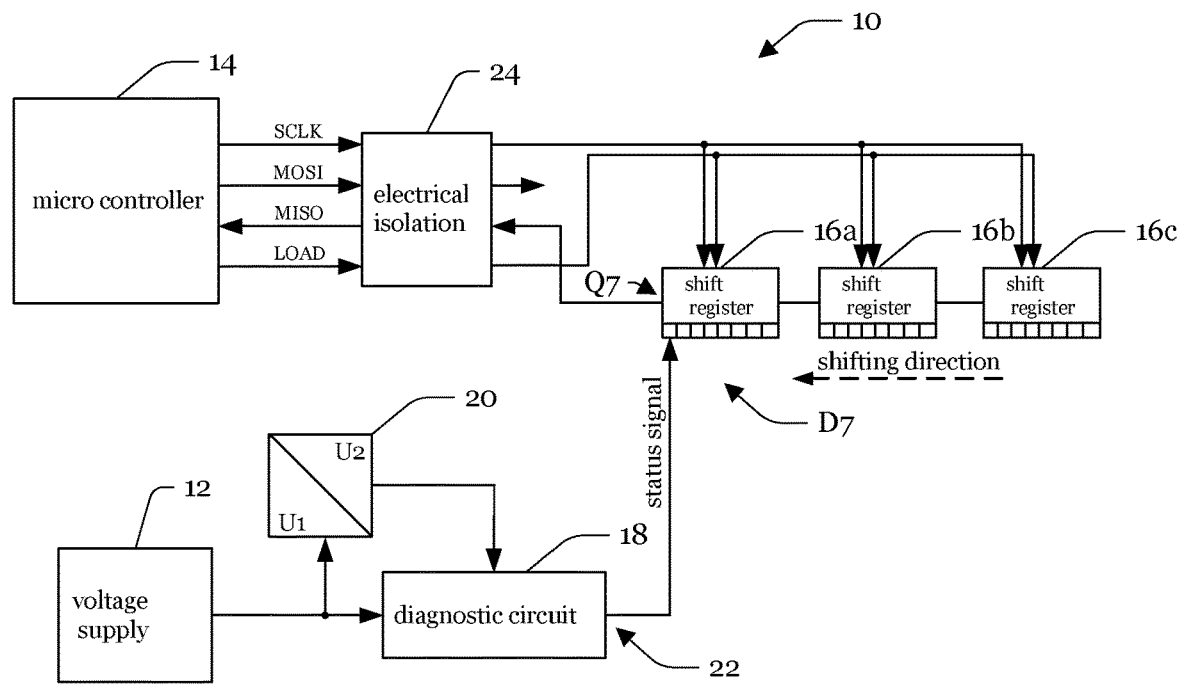
FIG. 1 shows a block diagram of an exemplary circuit for monitoring an output voltage of a voltage supply.

FIG. 1 shows a block diagram of an exemplary circuit 10 for monitoring an output voltage of a voltage supply 12. The circuit 10 comprises a microcontroller 14 for controlling a system (not shown in FIG. 1), a plurality of shift registers 16a-16c and a diagnostic circuit 18. The diagnostic circuit 18 is used to monitor the output voltage U1 of the voltage supply 12 (e.g., a 24V field supply) for undervoltage. If the output voltage U1 of the voltage supply 12 falls below a threshold value $U_{GRENZ}$, as shown in FIGS. 2a and 2b, the diagnostic circuit 18 signals this at the diagnostic output 22 by changing a status signal (for example by changing a status signal level).

The diagnostic output 22 of the diagnostic circuit 18 is connected to a data input D7 of a shift register 16a for inputting a diagnostic bit. The microcontroller 14 has an input for receiving serial output data of the shift registers 16a-16c, wherein the input is connected to the serial output Q7 of the shift register 16a via an (optional) electrical isolation 24 (for example an optocoupler or a digital isolator).

Thereby, the status signal can be read in via the shift register 16a and the serial input of the microcontroller 14 as a diagnostic bit.

Figure 2A:
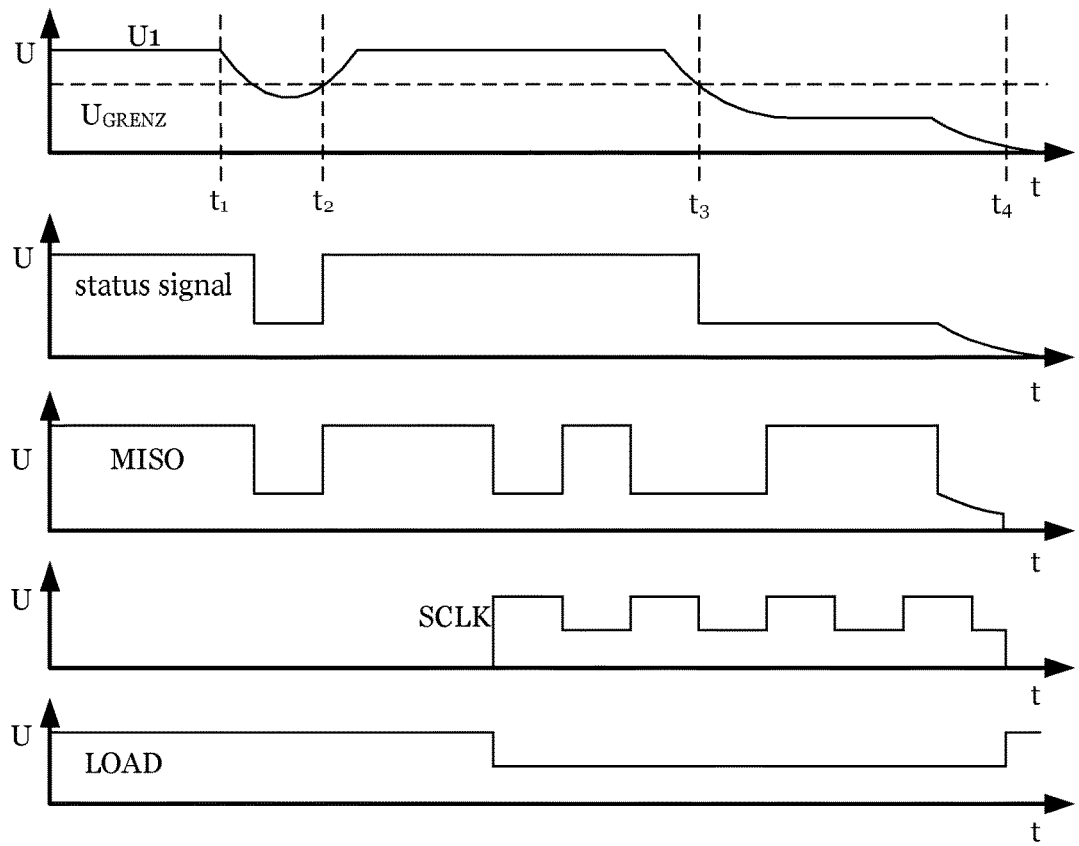
FIG. 2a is a schematic representation of voltage profiles at selected inputs/outputs in the exemplary circuit of FIG. 1, according to the first example.
Figure 2B:
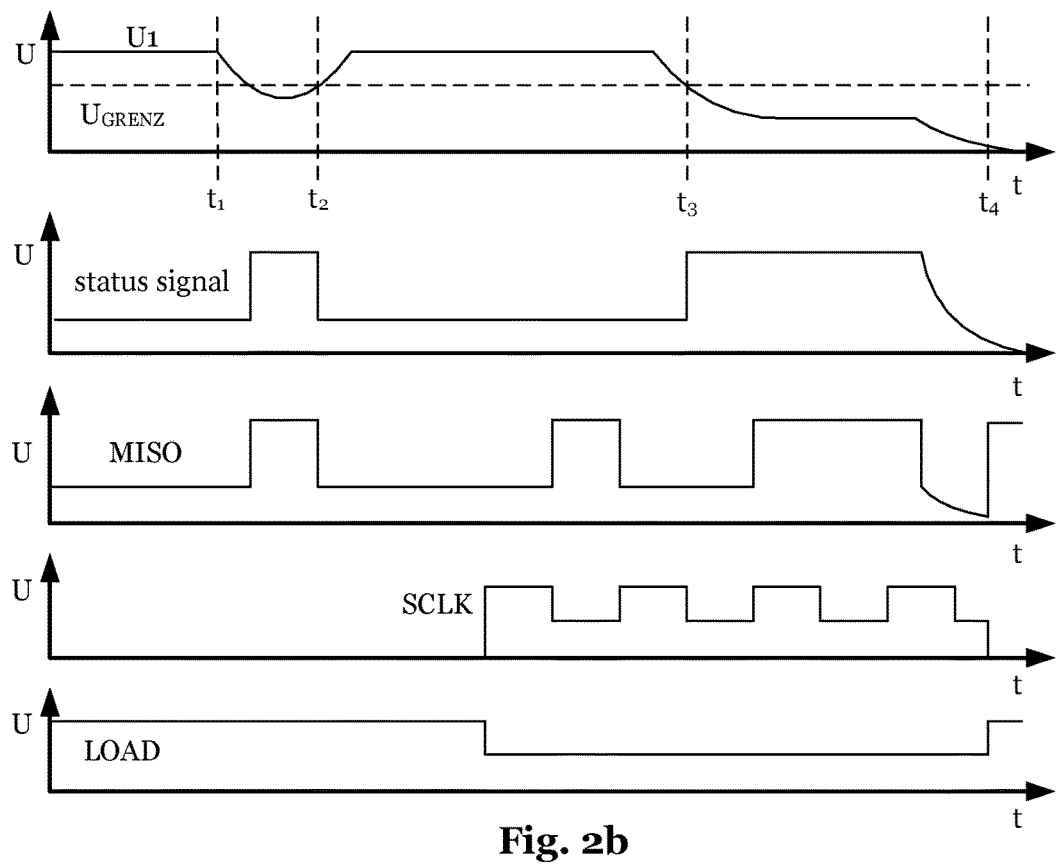
FIG. 2b is a schematic illustration of voltage profiles at selected inputs/outputs in the exemplary circuit of FIG. 1, according to a second example.

For example, (as shown in FIGS. 2a and 2b), an undervoltage ($U1 < U_{GRENZ}$) can be signaled by outputting a defined logic level, e.g., by outputting a low level or a high level at the diagnostic output 22. In addition, the diagnostic circuit 18 is not limited to the detection of an undervoltage. E.g., the diagnostic circuit 18 can be designed to monitor the output voltage U1 for overvoltage instead of monitoring, or in addition to monitoring, the output voltage U1 for undervoltage. Furthermore, if the diagnostic circuit 18 is designed to monitor the output voltage U1 for undervoltage and overvoltage, a status signal can be output, the level of which signals as to whether there is an undervoltage or an overvoltage.

Furthermore, instead of a single status signal, two status signals can be output, wherein for example the level of a status signal is associated with the signaling of an undervoltage and the level of the remaining status signal is associated with the signaling of an overvoltage. Alternatively, the level of a status signal can signal as to whether there is an undervoltage or an overvoltage (or neither an undervoltage nor an overvoltage) and the level of the remaining status signal in the case of an undervoltage or overvoltage can signal whether there is an undervoltage or whether there is an overvoltage. The status signals can, for example, be output serially via the diagnostic output 22 or in parallel via two diagnostic outputs (not shown).

By outputting a low level for signaling voltage supply problems (i.e., overvoltage or undervoltage), it can be avoided in embodiments in which the supply voltage U2 (logic voltage) of the diagnostic circuit 18 is generated from the output voltage U1 of the monitored voltage supply 12 (by a voltage converter 20) that in the event of a full breakdown of the output voltage U1, as for example in FIG. 2a starting at time $t_4$, a falsified status signal due to voltage drop is output at the diagnostic output 22 of the diagnostic circuit 18.

However, it can also be advantageous to signal voltage supply problems (i.e., undervoltage or overvoltage) by outputting a high level. E.g., the (optional) electrical isolation 24 can be set up to generate a high level in the event of a complete failure of the voltage supply 12, as shown, for example, in FIG. 2b at time $t_4$. When using a high level for signaling voltage supply problems, a voltage-drop-related, falsified transfer of the status signal level via the electrical isolation 24 can then be avoided.

FIG. 2a shows a schematic illustration of voltage profiles at selected inputs/outputs of the circuit of FIG. 1, wherein an undervoltage is signaled by the diagnostic circuit 18 by outputting a low level at the diagnostic output 22. In the illustration shown in FIG. 2a, the output voltage U1 begins to drop at the time $t_1$. E.g., a connection to the voltage supply 12 may have been interrupted. As long as the output voltage U1 is still above the limit voltage $U_{GRENZ}$, a high level is generated at the diagnostic output 22 of the diagnosis circuit 18. After the output voltage U1 has dropped below the limit voltage $U_{GRENZ}$, a low level is generated at the diagnostic output 22 of the diagnostic circuit 18, signalizing a problem with the voltage supply.

As shown in FIG. 2a, a bit value (diagnostic bit) corresponding to the respective level of the status signal is stored at the first bit position of the shift register 16a, which is connected to the diagnostic circuit 18. A level corresponding to the bit value stored at the first bit position is also generated at the serial output Q7 of the shift register 16a, which is connected to the input of the microcontroller 14. This makes the diagnostic bit value available to the microcontroller 14 (or allows for monitoring by the microcontroller 14), without the (complete) shift register 16a having to be read out by the microcontroller 14. Since the status signal is continuously read in at the corresponding level of the LOAD signal, the bit value changes again at the time $t_2$, at which the output voltage U1 rises above the limit voltage $U_{GRENZ}$. As a result, the overcoming of a (temporary) voltage supply problem can also be signaled to the microcontroller 14 without the (complete) shift register 16a having to be read out by the microcontroller 14.

The readout of the shift register 16a connected to the input of the microcontroller 14 can then be effected (with an inverted LOAD level) by applying a clock signal SCLK to clock inputs of the shift registers 16a-16c. By applying the clock signal SCLK to the clock inputs of the shift registers 16a-16c, the data stored in the shift registers 16a-16c is shifted with the clock signal SCLK along the shifting direction to the serial output Q7 connected to the input of the microcontroller 14, whereby the bit values stored in the shift registers 16a-16c are successively output via the serial output Q7.

The drop in the output voltage U1 below the limit voltage $U_{GRENZ}$ at the time $t_3$ (in the embodiment shown) cannot be detected by the microcontroller 14. However, since the data stored in the shift registers 16a-16c was recorded at a point in time when the output voltage U1 was above the limit voltage $U_{GRENZ}$, this does not question the integrity of the recorded data. If the shift registers 16a-16c are supplied by the voltage supply 12, however, the drop in the output voltage U1 below the limit voltage $U_{GRENZ}$ at a time $t_3$ can affect the function of the shift registers 16a-16c.

To take this into account, the (optional) electrical isolation 24 can be set up to signal a complete drop in the output voltage U1 by outputting a static level at the time $t_4$. Said level can be detected by the microcontroller 14 and the microcontroller 14 may be configured to output an (inverted) LOAD level in response to detecting the static level, which causes a read in of the status signal, whereby an overcoming of the voltage supply problem can be detected when the output voltage U1 is restored.

FIG. 2b shows a schematic illustration of voltage profiles at selected inputs/outputs of the circuit of FIG. 1, wherein the diagnostic circuit 18 signals an undervoltage by outputting a high level at the diagnostic output 22. The electrical isolation 24 thereby generates a high level at the MISO input of the microcontroller 14 at a time $t_4$, which signals a voltage supply problem to the microcontroller 14 when the SCLK signal stops.

Figure 2C:
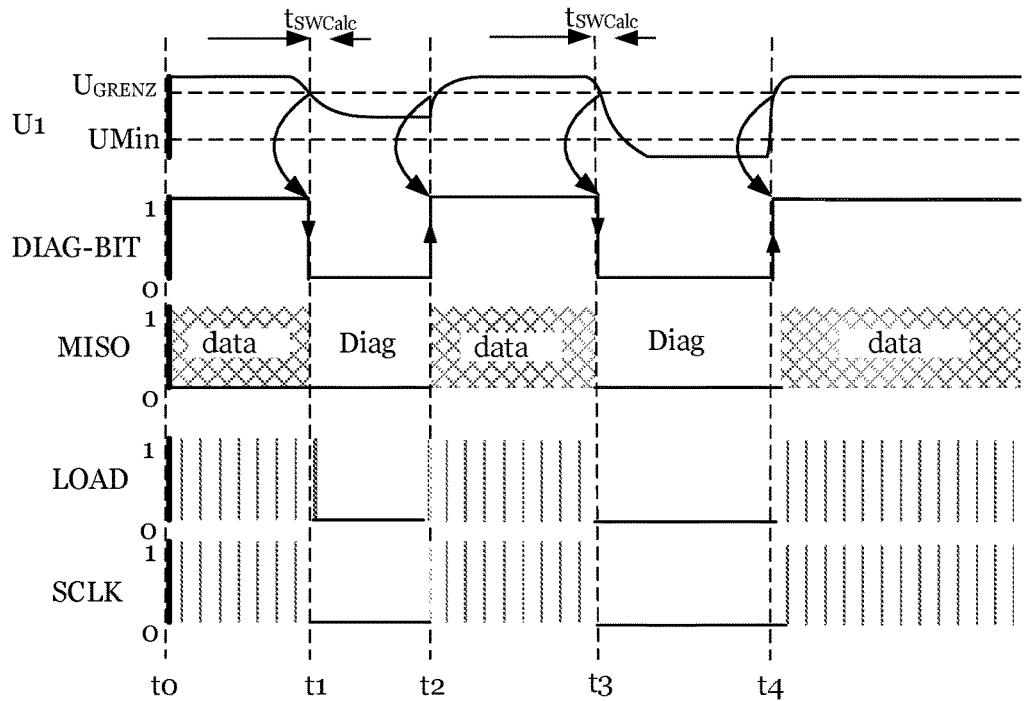
FIG. 2c is a schematic representation of signals at selected inputs/outputs in the exemplary circuit of FIG. 1, according to a further example.

FIG. 2c shows a schematic representation of signals at selected inputs/outputs in the exemplary circuit of FIG. 1 according to a further example, wherein a faulty output voltage U1 from the diagnostic circuit 18 is signaled by outputting a high level at the diagnostic output 22. At the time to, a normal operation takes place in which there are no voltage supply problems and data stored in the shift registers 16a-16c is read in via the MISO input of the microcontroller 14. The LOAD line is operated regularly and the SCLK signal clocks the data into the microcontroller 14.

At the time t1, the output voltage U1 falls below the limit voltage $U_{GRENZ}$. For example, said limit voltage is at 18V when the output voltage U1 amounts to 24V in the normal operation mode. From the output voltage U1, a logic supply is generated via a switching regulator/voltage converter (e.g., a 3.3V or a 5V logic supply). The logic supply can be generated from the output voltage U1 (fault-free) which is below the limit value $U_{GRENZ}$, as long as it is above the voltage UMin.

With a certain processing time, tSWCalc, the microcontroller 14 detects that the diagnostic bit (DIAG bit), which signals the status of the output voltage U1, signals an erroneous output voltage U1 in the data stream and suspends data communication to the shift registers 16a-16c by the microcontroller 14 no longer clocking the SCLK line. The LOAD line is then kept at a static low level (which in another embodiment can also be a high level), as a result of which the DIAG signal is switched statically to the MISO line.

The microcontroller 14 now continuously queries the MISO input and checks as to whether the DIAG bit or the status signal signals a restoring of the output voltage U1. If the output voltage U1 exceeds the limit value $U_{GRENZ}$ again, as at the time t2, the DIAG bit changes its value to output voltage U1 "fault-free". Since the microcontroller 14 continuously polls the port pin of the data input signal (MISO), the software recognizes that the output voltage U1 is again within the normal range, whereupon data communication can be resumed. This means that the LOAD signal can be cyclically operated again and the SCLK signal can clock the input data.

If, such as at the time t3, the output voltage U1 fully drops and falls below UMin, the microcontroller 14 recognizes this at the DIAG bit and stops the data communication. The subsequent regular polling of the port pin takes place in the same manner as at time t1+SWCALC, with the only difference that the output voltage U1 has completely dropped. With appropriate circuit design, this can be recognized by the microcontroller 14 as a completely dropped output voltage U1.

For example, the electrical isolation 24 may comprise a digital isolator that permanently outputs a fixed level on the microcontroller side in the event of a complete drop of the output voltage U1. The fixed level can exactly match the level which denotes a faulty output voltage U1. As soon as the output voltage U1 is restored at time t4, the DIAG bit again signals the correct state of the output voltage U1.

Thus, while the diagnostic bit value can be output before the application of the clock signal SCLK and after the application of the clock signal SCLK via the serial output Q7, the output data stored in the shift registers 16a-16c can be output successively via the serial output Q7 while the clock signal SCLK is being applied. However, in another embodiment, the shift register 16a can be configured such that a reading out of the diagnostic bit value can only be effected by applying the clock signal SCLK, i.e., the diagnostic bit value is not output via the serial output Q7 prior to or after application of the clock signal SCLK.

Furthermore, a bit value corresponding to the respective level of the status signal can also be stored at a position other than the first bit position of the shift register 16a connected to the diagnostic circuit 18. In addition, the shift registers 16a-16c can include two shifting directions and both the reading in and the outputting of data can take place via the shift registers 16a-16c.

Figure 3:
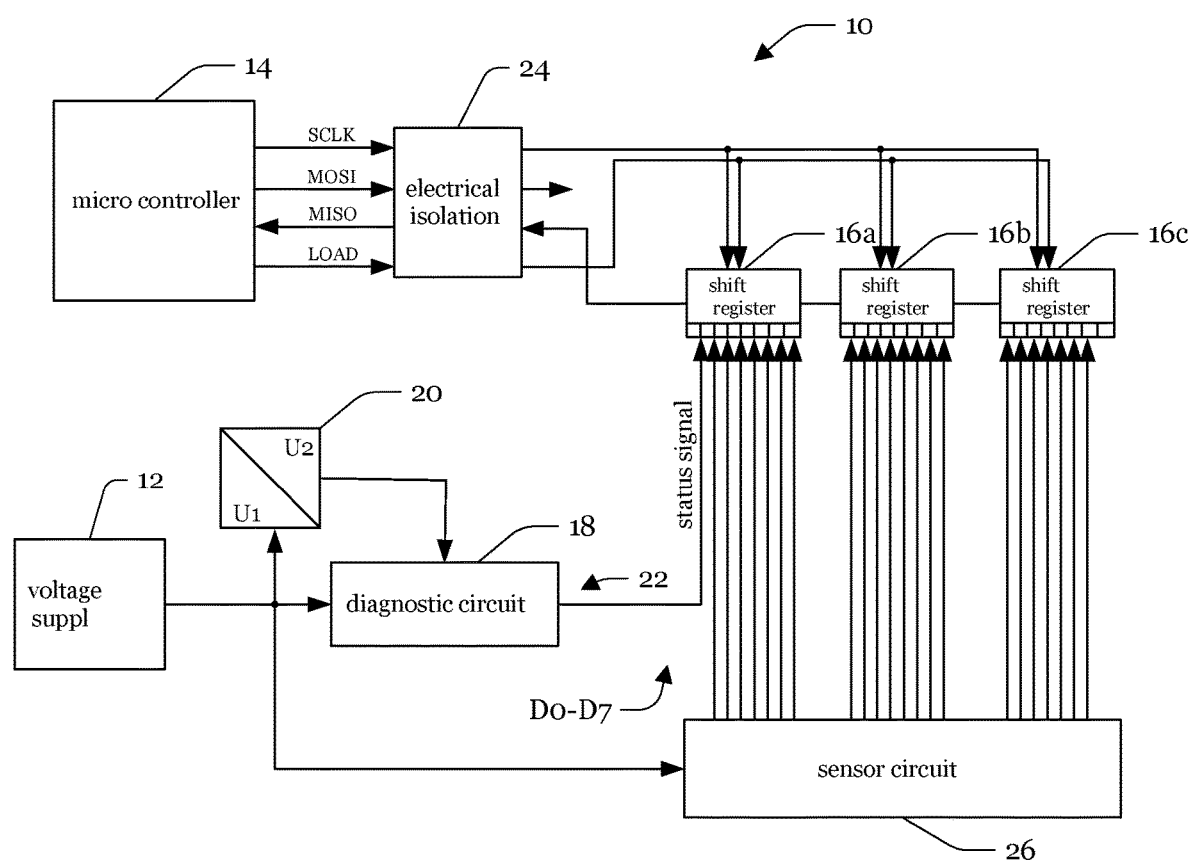
FIG. 3 is a block diagram with additional elements of the exemplary circuit of FIG. 1.

FIG. 3 shows a block diagram with additional elements of the exemplary circuit 10 of FIG. 1. In particular, FIG. 3 shows a sensor circuit 26 which comprises one or more sensors and a plurality of parallel outputs for providing measurement data. The outputs of the sensor circuit 26 are connected to parallel inputs D0-D7 of the shift registers 16a-16c. Thus, the sensor data can be loaded into the shift registers 16a-16c in parallel. The sensor circuit 26 is also supplied by the voltage supply 12. If an undervoltage or overvoltage occurs, the functionality of the sensor circuit 26 can be impaired and as a result, no sensor data or incorrect sensor data may be provided.

This problem can be mitigated in this respect by the provision of the diagnostic bit value (or a plurality of diagnostic bit values) since the microcontroller 14 can reduce the risk of using incorrect data by evaluating the diagnostic bit value (or the diagnostic bit values) and by discarding the (possibly) affected sensor data when an undervoltage or overvoltage occurs. E.g., if an undervoltage or overvoltage occurs, the microcontroller 14 can corroborate the sensor data, use sensor data from a redundant sensor circuit (not shown), or stop a process that is controlled on the basis of the sensor data.

Figure 4:
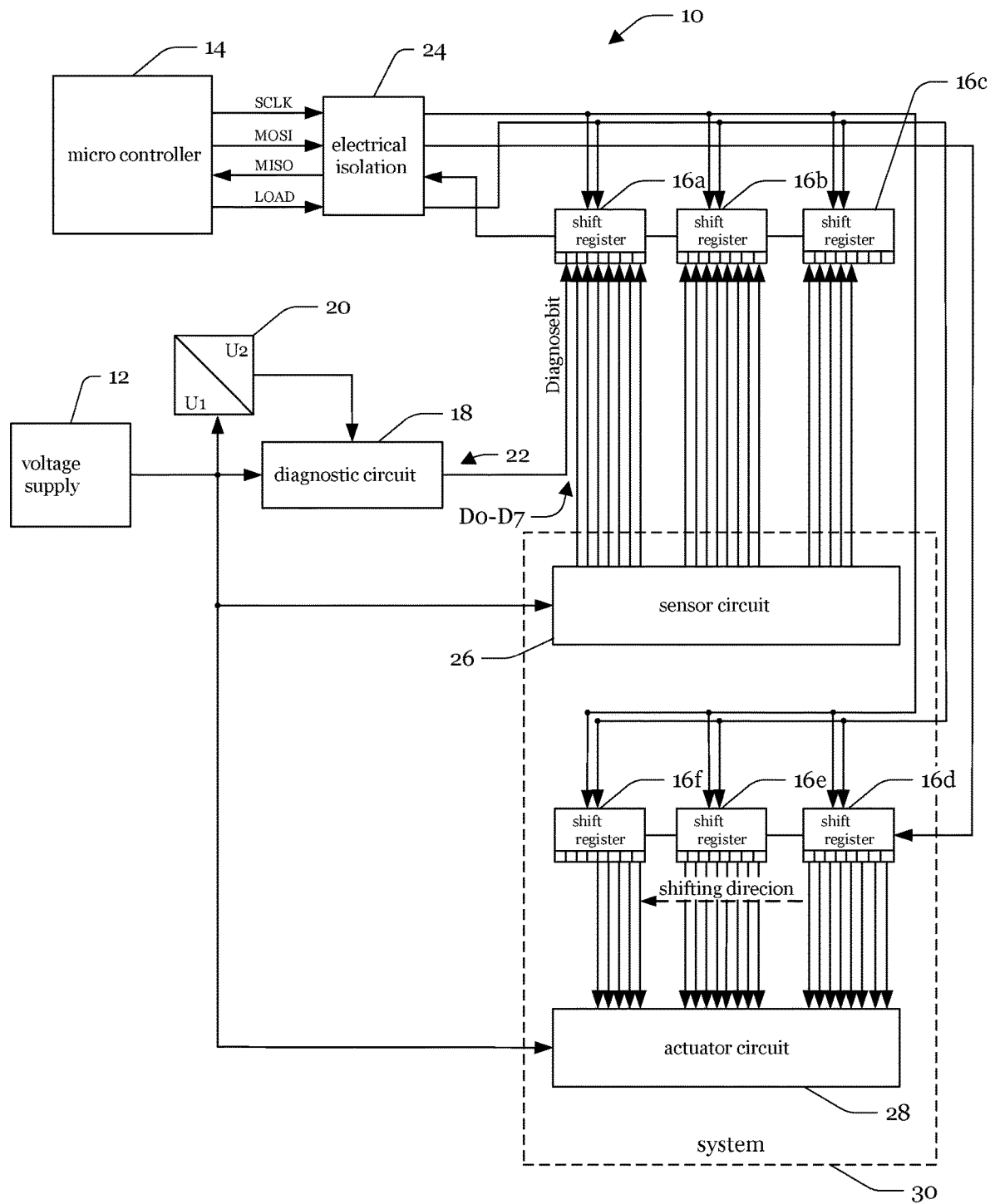
FIG. 4 is a block diagram with additional elements of the exemplary circuit of FIG. 3.

FIG. 4 shows a block diagram with additional elements of the exemplary circuit 10 of FIG. 3. In particular, in addition to the sensor circuit 26 shown in FIG. 3, FIG. 4 shows an actuator circuit 28 which is also supplied by the voltage supply 12. The sensor circuit 26 and the actuator circuit 28 are part of a system 30 controlled by the microcontroller 14. For example, the microcontroller 14 controls one or more actuators of the actuator circuit 28 on the basis of sensor data from the sensor circuit 26. One or more actuators of the actuator circuit 28 can be involved in a process which is influenced/controlled by the actuators. If undervoltage is detected, the microcontroller 14 can, for example, stop the actuators or switch them to a predetermined state in order to prevent the system 30 from being in a possibly uncontrolled (unwanted) state.

Figure 5:
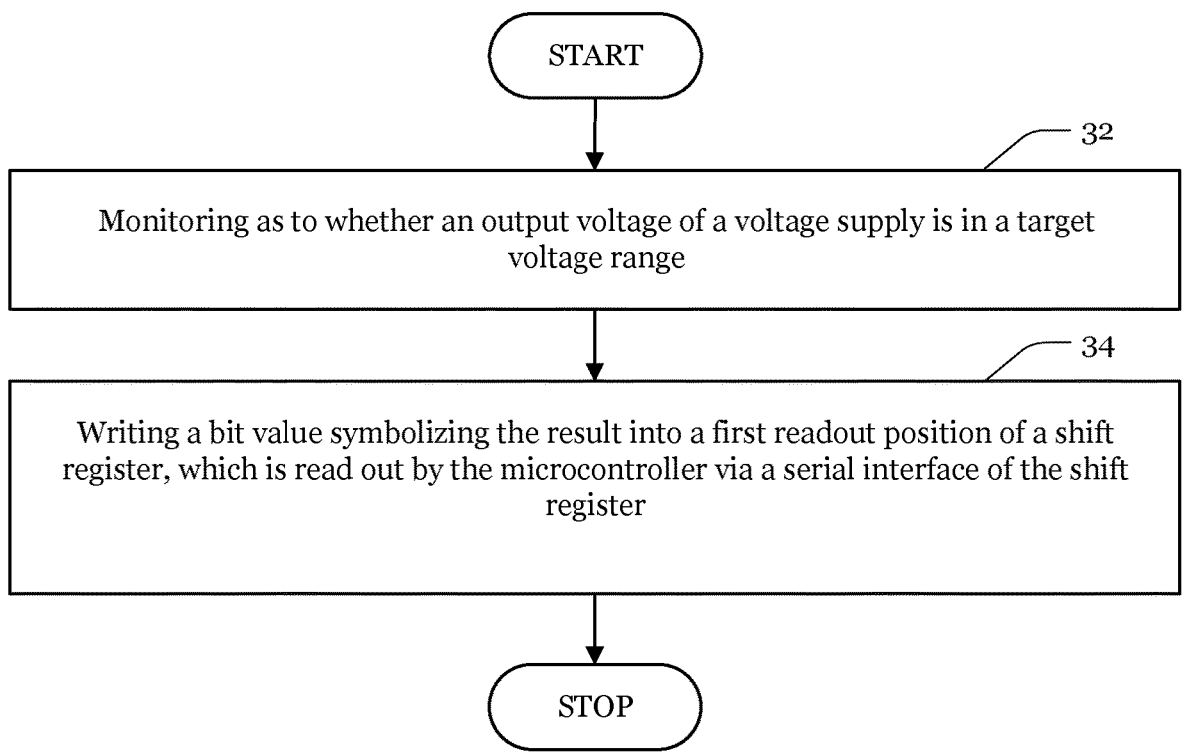
FIG. 5 is a flowchart of a process for monitoring an output voltage of a voltage supply.

FIG. 5 shows a flowchart of a process for monitoring an output voltage of the voltage supply 12. At 32, it is monitored as to whether the output voltage of the voltage supply 12 is in a target voltage range. At 34, a bit value symbolizing the result of the monitoring is written into a first readout position of the shift register 16a, which is read out by the microcontroller 14 via the serial interface Q7 of the shift register 16a. The bit value can be written into the first readout position of the shift register 16a without clocking the shift register 16a.

To transfer the monitoring result to the microcontroller 14, as shown in FIGS. 1, 3 and 4, an I/O transfer path can be used, which is operated via a serial synchronous interface. The I/O transfer path can control shift registers 16a-16c designed as parallel-to-serial converters, which are operated on the field side and supplied via a field-side logic supply U2, wherein the field-side logic supply U2 can be generated from (a 24 V field voltage) U1. Furthermore, the logic supply U2 can also be generated from the voltage of a logic potential.

U1 and also U2 can be monitored via the diagnostic circuit 18 for undervoltage and for overvoltage. Based on the monitoring, the diagnostic circuit 18 generates a status signal, which, when the supply voltage U1/U2 is fault-free, for example corresponds to a low level, and when the supply voltage U1/U2 is faulty, for example corresponds to a high level, wherein the reverse behavior is also possible.

The status signal can be read in and further processed via the shift register 16a designed as a parallel-serial converter by one (or more) microcontrollers 14 on the logic potential. In this case, the status signal can be written to the first bit position of the parallel-serial converter, whereby the diagnostic bit is the first bit which is read in by the one (or more) microcontrollers 14 during clocking of the I/O transfer path.

When the parallel-serial converter, as shown in FIGS. 2a-2c, is designed such that the signal state of the connection pin for the first bit is output to the serial output Q7 even without clocking the I/O transfer path, then it is also possible to read in the status signal without clocking the transfer path.

As a result, simply by querying the signal state at the corresponding connection pin (MISO) of the microcontroller 14 and without operating (i.e., without clocking) the serial synchronous interface, the state of the voltage supply 12 (field supply) can be queried and checked for recovery.

Furthermore, an optocoupler/digital isolator and a connection/port pin on the microcontroller 14 can be omitted because a pin is used on the port expander and not on the microcontroller 14, which would possibly be unoccupied anyway (as shown in FIGS. 3 and 4). Extending the port expander is also possible at any time (by adding a further shift register 16), whereas the number of microcontroller pins is typically limited.

If the circuit 10 is part of a safety-oriented system, a two-channel structure of the hardware may be necessary due to normative requirements. In particular, the system may comprise two microcontrollers 14, two I/O transfer paths and two diagnostic circuits 18.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit comprising:
    a microcontroller to control a system;
    a shift register; and
    a diagnostic circuit;
    wherein the microcontroller is connected to a first voltage supply and has an input for receiving serial output data of the shift register, the input being connected to a serial output of the shift register,
    wherein the shift register has at least one data input, and
    wherein the diagnostic circuit diagnoses a second voltage supply and a diagnostic output of the diagnostic circuit is connected to a data input of the shift register for inputting a diagnostic bit.

2. The circuit according to claim 1, wherein the data input is part of a parallel interface of the shift register.

3. The circuit according to claim 1, wherein the data input of the shift register is set up to store the diagnostic bits in a memory location, the content of which is output first at the serial output.

4. The circuit according to claim 3, wherein the shift register is set up to apply the value of the corresponding diagnostic bit to the input of the microcontroller without the application of a clock signal at a clock input of the shift register and/or a logic voltage applied to the shift register.

5. The circuit according to claim 1, further comprising:
    one or more sensors, which are designed to connect to the second voltage supply,
    wherein one or more data inputs of the shift register are connected to the one or more sensors for inputting sensor data.

6. The circuit according to claim 1, wherein the diagnostic circuit is designed to connect to the second voltage supply.

7. The circuit according to claim 6, wherein the diagnostic circuit is set up to signal an undervoltage or overvoltage of the second voltage supply via a bit value.

8. The circuit according to claim 1, wherein the shift register is disposed between the diagnostic circuit and the microcontroller.

9. The circuit according to claim 1, wherein the microcontroller is devoid of a separate input pin for connection to the diagnostic circuit.

10. The circuit according to claim 1, wherein said serial input comprises a connection through which data is read sequentially at a certain clock pulse.

11. The circuit according to claim 1, wherein the shift register is one of a plurality of shift registers.

12. The circuit according to claim 1, wherein the microcontroller is connected to the shift register.

13. The circuit according to claim 1, further comprising an electrical isolation between the microcontroller and the shift register.

14. A method for monitoring an output voltage of a voltage supply, the method comprising:

monitoring whether the output voltage is in a target voltage range;

signaling a result of the monitoring to a microcontroller; and writing a bit value symbolizing the result into a readout position of a shift register, which is read out first by the microcontroller via a serial interface of the shift register.

15. The method according to claim 14, further comprising:

ongoing application of a voltage, which represents a bit value stored in a first readout position of the shift register to a signal line that is connected to the serial interface, which connects the microcontroller to the shift register.

16. The method according to claim 14, further comprising:

controlling a system based on measurement data read out from the shift register, wherein the measurement data is generated by sensors, to which the output voltage or a voltage derived from the output voltage is applied.

* * * * *